(12) United States Patent
Pellon

(10) Patent No.: US 6,271,781 B1
(45) Date of Patent: Aug. 7, 2001

(54) NONLINEAR FILTER CORRECTION OF MULTIBIT ΣΔ MODULATORS

(75) Inventor: Leopold Ernest Pellon, Mt. Holly, NJ (US)

(73) Assignee: Lockheed Martin Corporation, King of Prussia, PA (US)

( * ) Notice: Subject to any disclaimer, the term of this patent is extended or adjusted under 35 U.S.C. 154(b) by 0 days.

(21) Appl. No.: 09/260,228

(22) Filed: Mar. 1, 1999

Related U.S. Application Data

(60) Provisional application No. 60/088,711, filed on Jun. 10, 1998.

(51) Int. Cl.[7] .................................................. H03M 1/66
(52) U.S. Cl. ............................................. 341/143; 341/155
(58) Field of Search ..................................... 341/143, 155

(56) References Cited

U.S. PATENT DOCUMENTS 5,778,310 * 7/1998 Tong et al. ............................ 455/306

5,995,565 * 11/1999 Tong et al. ............................ 375/346

* cited by examiner

*Primary Examiner*—Peguy JeanPierre
(74) *Attorney, Agent, or Firm*—William H. Meise

(57) ABSTRACT

A Σ-Δ analog-to-digital converter (ADC) 210 includes a multibit Σ-Δ modulator 216 and a feedback loop 240, 241 including a digital-to-analog converter (DAC) 241. A nonlinear filter corrector 250 coupled to the multibit output port 216o of the modulator 216 includes a transversal filter 252, weighting multipliers 256 coupled to the taps 254 of the transversal filter 252, and a summing arrangement 258, 260 coupled to the multipliers, for creating a correction signal based on an estimate of the dynamic errors of the Σ-Δ ADC. A calibration arrangement 280 applies an alternating calibration signal to the input port 212 of the Σ-Δ ADC 210, and determines, from the output signal of the modulator 216 and from the known delays L of the delay elements of the transversal filter 252, the values of the weights required to correct dynamic errors of the DAC. In one version, the weighting multipliers are look-up tables.

5 Claims, 12 Drawing Sheets

$$y_d(t) = \sum_{n=-\infty}^{\infty} \sum_{i=1}^{N_T} c_i(n) \, W_i \, h_{\varepsilon i}(t-nT_s)$$

$$\overline{W}_i = \begin{cases} \overline{W}_{Bi} = 2^i & \text{(binary)} \\ \overline{W}_{Ti} = 1 & \text{(thermometer)} \\ \overline{W}_{Li} = i & \text{(level)} \end{cases} \quad \text{for } i = 0, 1, \ldots N$$

NONLINEAR FILTER CORRECTION OF MULTIBIT ΣΔ MODULATORS

This patent application claims priority of Provisional patent application Ser. No. 60/088,711, filed Jun. 10, 1998.

FIELD OF THE INVENTION

This invention relates to analog-to-digital converters, and more particularly to such converters using sigma-delta (ΣΔ) modulators, and more particularly multibit sigma-delta modulators.

BACKGROUND OF THE INVENTION

FIG. 1 is a simplified block diagram of a multibit sigma-delta analog-to digital converter 10 of a type generally known in the art, which includes correction of static non-linearities introduced by a multibit DAC in the sigma-delta (ΣΔ) feedback loop. The correction of FIG. 1 results in significant reduction in passband DAC errors, given sigma-delta converters using low clock rates and narrow bandwidths (clock rates of about 5 MHz and bandwidths less than about 100 KHz at the current state of the art). Increased- or high-bandwidth sigma-delta converters use higher clock rates and wider bandwidths (clock rates of 500 MHz to 3.3 GHz, and bandwidths of 10 MHz to 100 MHz, at the present state of the art), and noise shaping bands centered at carriers such as 70 MHz to 1 GHz, at the present state of the art. The high-speed DACs used in such high-bandwidth sigma-delta loops will introduce error terms which result both from static and dynamic nonlinearities. The dynamic nonlinearities which account for mismatches in rise and fall times and overall delay skew between DAC levels differ from static nonlinearities, which account for only amplitude errors. The dynamic error is generally the dominant error term in high-speed multibit sigma-delta analog-to-digital converters. Therefore, multibit sigma-delta error correction capable of correction of dynamic nonlinearities would be advantageous.

In the arrangement of FIG. 1, analog input signals applied to an analog input port 12 are summed in a summing circuit 14 with correction signals applied to an input port 142 from a signal path 24. The summed analog and correction signals are applied from summing circuit 14 to an input port 16i of a baseband multibit signal-delta modulator 16. Parallel sampled binary digital signals representing the analog input signals applied to input port 16i are produced at output port 16o. The digital signals at output port 16o are applied to the address input ports of a programmable ROM and to a static DC level calibrator 20. PROM 18 is preprogrammed at each memory location with error correction values established by the static DC level calibrator 20, for producing corrected signals y(n) at its output port 18o. Averaging circuit 20 receives the parallel sampled binary digital signals y(n) from output port 16o and averages or integrates the samples in an averager 22 by summation over a large number of samples, such as for example one thousand or more samples. The parenthetical expression (n) in the expression y(n) represents the index number of each of the samples. The averaging in block 20 removes quantization noise produced by the baseband multibit sigma-delta (Σ-Δ) modulator 16. The averaged samples are applied to level calibrator 20, which, at initial turn-on, or during a calibration procedure, produces a known direct level, such as a direct voltage or bias, which is applied over a signal path 24 to input port 14i of summing circuit 14, for addition or injection of the direct level for measuring direct (DC) offsets at the output of multibit sigma-delta modulator 16. The DC calibrator will inject a direct level corresponding to each of the multibit quantization levels. The averager provides measured offsets for each of these levels. These measured offsets are subtracted from the corresponding level values, to produce look-up table values which compensate for the offsets when applied to PROM 18. Static DC level calibrator 22 also produces signals which program the memory locations according to this table. After the initialization or calibration period, the static DC level calibrator becomes inactive. In operation of the analog-to-digital converter 10 of FIG. 1, PROM 18 removes error introduced into the passband of the sigma-delta modulator 16 produced by the multibit digital-to-analog converter inherent therein.

As so far described, the arrangement of FIG. 1 is that of a known analog-to-digital converter. It should be noted that the PROM 18 and feedback calibrator 22 correct only baseband nonlinearity errors produced by static or constant gain mismatches inherent in the sigma-delta modulator, because averager 20 can only detect direct bias errors occurring at or near zero Hz.

In order to more fully explain the sources of the errors in sigma-delta modulator 16, a sigma-delta modulator is illustrated within block 16. The particular sigma-delta modulator which is illustrated is the multibit Σ-Δ modulator with static error correction which is described in M. Nejad & G. Temes, "Multibit Oversampled Sigma-Delta A/D Converter with Digital Error Correction," published at pp. 1051–1052 in Vol. 24 of IEEE Electronics Letters, June 1993. The arrangement of FIG. 1 illustrates the Nejad et al. converter within block 16.

In FIG. 1, analog-to-digital converter 16 includes a first summing circuit 30 which has a noninverting (+) input port $30_1$ coupled to the output port of summing circuit 14, and an inverting (−) input port 302 coupled for receiving, from a feedback signal path 41b, feedback signal in the form of reconstructed analog signal. First summing circuit 30 subtracts the reconstructed analog signal from the analog input signal applied to input port 16i, to generate a Δ(t) signal. The Δ(t) signal is applied through an additional theoretical or hypothetical summing circuit 32 to an input port of an integrating loop filter 34. Hypothetical summing circuit 32 is considered to be the location at which equivalent input loop filter noise η(t) of the following circuits is added to the Δ(t) signal.

Integrating loop filter 34 integrates the delta signal from hypothetical summing circuit 32, to produce integrated signals u(t) at its output port. The integrating loop filter 34 has poles place near zero Hz for producing frequency selective gain in the passband of the sigma-delta modulator, which is centered at zero Hz. In order to have gain, the loop filter 34 is preferably an active filter. The filtered signals u(t) at the output port of filter 34 are applied to a multibit analog-to-digital converter illustrated as a block 36, which operates at the frequency $f_s$ of a clock signal applied over a signal path 37. Block 36 includes a further hypothetical noise source illustrated as a summing circuit 38, which adds to the digitized output signal a noise component which can be termed ADC quantization noise or equivalent error signals e(n), which includes quantization noise. The digitized (discrete in both time and level) output signals from ADC 36 are applied as an output signal to output port 16o of sigma-delta modulator 16, and within sigma-delta modulator 16, are applied over a feedback signal path 41a of a feedback loop 39 to a digital-to-analog converter illustrated as a block 40.

Within feedback loop 39, DAC 40 converts the digitized signal from the output port of ADC 36 into the reconstructed analog signal at the clock frequency $f_s$, and applies the resulting converted signal over a signal path 41b of feedback loop 39 to the inverting input port $30_2$ of summing circuit 30. As illustrated in FIG. 1, DAC 40 also includes a further hypothetical summing circuit 42, which adds an equivalent error signal, produced by nonlinearity of the ADC 40, to the converted output signal. As suggested by dotted line 44, the ADC 36 and DAC 40 are often a part of a common integrated circuit.

It should be noted that for simplicity of design and operation, ADC 36 and DAC 40 may use specialized forms of coding, such as binary, thermometer, and level. The coupling between ADC 36 and output port 26o of multibit analog-to-digital converter 16 often includes a code converter, illustrated as 17, for converting the code used internally between ADC 36 and DAC 40 into ordinary digital code at output port 16o.

In the arrangement of FIG. 1, sigma-delta modulator 16 processes noise over its passband produced by nonlinearity in the DAC 40, which, at the output of the ADC 36, tends to be larger than the shaped quantization noise characterized as the ADC quantization noise e(n), attenuated by the noise transfer function of the sigma-delta modulator over the passband. The nonlinearity noise g(t) is not attenuated by the sigma-delta loop, and so tends to limit the dynamic range of the ADC 16. PROM 18 and static dc level calibrator 22 are provided in the prior art to ameliorate the effect of the nonlinearities produced by DAC 40 by at least partial cancellation or reduction of noise.

Improved analog-to-digital sigma-delta converters are desired.

SUMMARY OF THE INVENTION

An analog-to-digital converter according to an aspect of the invention, for converting analog input signals to parallel digital form, includes a multibit sigma-delta modulator including an input port to which the analog input signals are applied, and which produces an oversampled digital parallel data stream at its output port. The performance of the sigma-delta modulator is subject to errors caused by both dynamic and static nonlinearity. A nonlinear filter correction is coupled to the output port of the sigma-delta modulator, for receiving the parallel digital data stream. The nonlinear filter corrector, in response to the parallel digital data stream, generates at least one of a real and imaginary component (that is to say, the real component, the imaginary component, or both) of an estimate of the errors, and for subtracting the one (or both) of the real and imaginary components of the estimate of the errors from equivalent components of the parallel digital data stream. This subtraction producing at least a real component of the parallel digital data stream, corrected for the nonlinearity. A filter with at least a low-pass characteristic is coupled to receive the one of the real and imaginary components of the parallel digital data stream, for removing out-of-band signal components therefrom. In one embodiment of the invention, the filter with a low-pass characteristic is a decimation filter.

In an embodiment of the invention, the nonlinear filter corrector further generates the other one of the real and imaginary components, and subtracts both the real and imaginary components of the estimate of the error from equivalent components of the parallel digital data stream, for thereby generating, in addition to the real component, an imaginary component of the parallel digital data stream.

In a preferred embodiment of the invention, the nonlinear filter corrector comprises a tapped delay line coupled to the parallel data stream, for generating a delayed sample of the parallel data stream at least one tap. A lookup table is coupled to the tap, for producing real and imaginary components of the estimated error of the delayed sample. A summing arrangement is coupled to the parallel digital data stream and to the lookup table, for subtracting the real and imaginary components of the estimated error from corresponding components of the parallel digital data stream.

DESCRIPTION OF THE INVENTION

Figure 1:
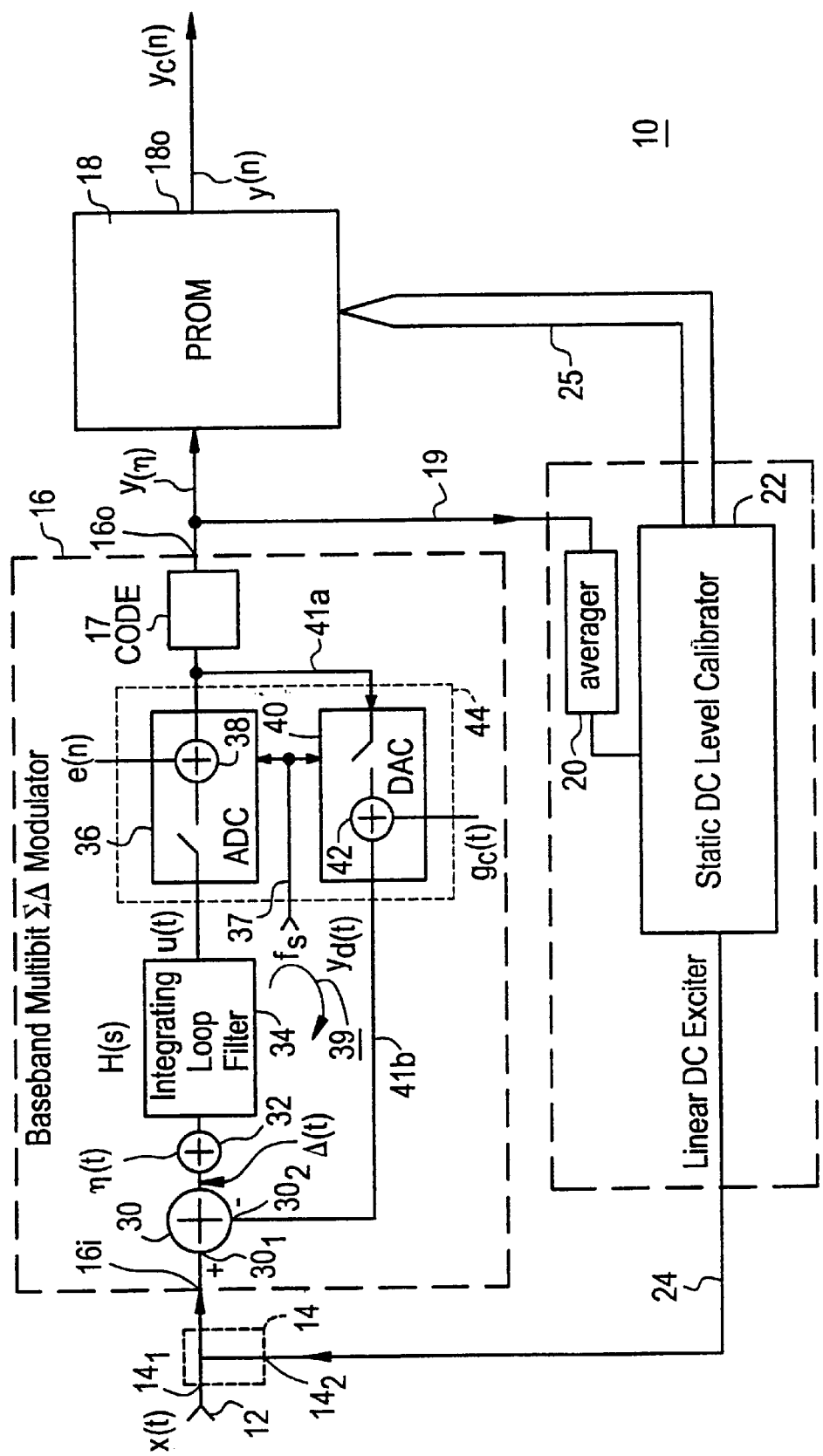
FIG. 1 is a simplified diagram, in block and schematic form, of a generalized prior-art sigma-delta analog-to-digital converter including a generalized sigma-delta modulator block, and illustrating a particular prior-art sigma-delta modulator within the generalized modulator block.

PROM 18 of FIG. 1 is programmed with a table of values which provides a transfer function that inherently cancels the effect of the static mismatches produced by DAC 40. The values are obtained by calculation of estimated nonlinearity errors from a straight-line least-squares fit of the bias estimates produced by averager 20. The calculation of the errors by Nejad et al. is based on a priori knowledge of the dc level applied from the external signal source to input port $14_2$, which requires high linearity in the direct voltage generated by the static dc level calibrator 22 in order to avoid calibration errors. For each sample of signal produced at output port 16o of sigma-delta ($\Sigma$-$\Delta$) modulator 16 of FIG. 1, which addresses a memory location of PROM 18, the corresponding value produced by the memory from the accessed location includes the input (address) value plus an error-correction value. The representation of the basic value plus the error-correction value requires more bits than would be required for representation of the basic value alone.

When the ADC 10 of FIG. 1 is operated at high clock rates in order to convert analog signals containing high-frequency components into digital form, it is found that the DAC 40 produces dynamic nonlinearity errors in addition to the static errors described above. These dynamic errors are not detected during calibration, and so remain uncorrected. The PROM cannot be programmed to correct these dynamic errors, because such a correction would require multiple correction values for each uncorrected signal sample which addresses the PROM. In this context, static errors include those errors produced by mismatches in the cells of the digital-to-analog converter which produce an analog response to a digital input, and which mismatches are constant over time. Dynamic errors include those which vary with time and which manifest themselves as variations in rise and fall times of pulses, as well as variations in the amplitudes of pulses.

Figures 5A, 5B:
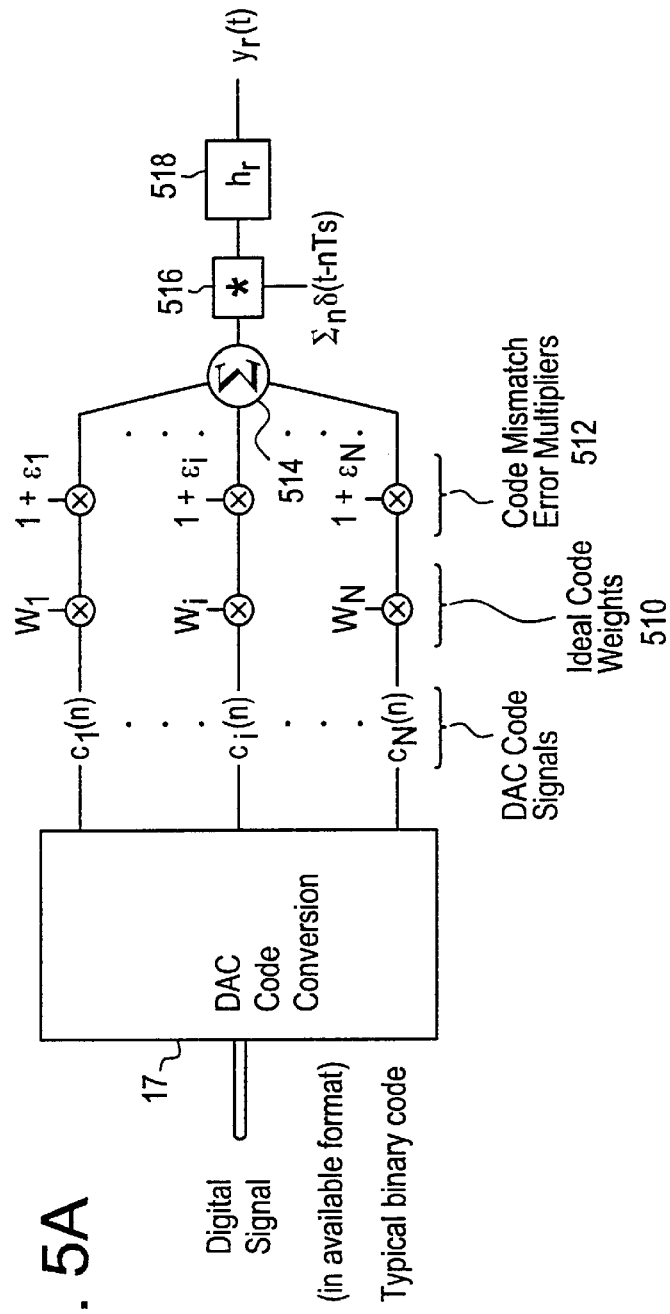
FIG. 5a is a simplified analytical representation of a portion of the arrangement of FIG. 1.
FIG. 5b is a mathematical representation thereof.
Figures 6A, 6B:
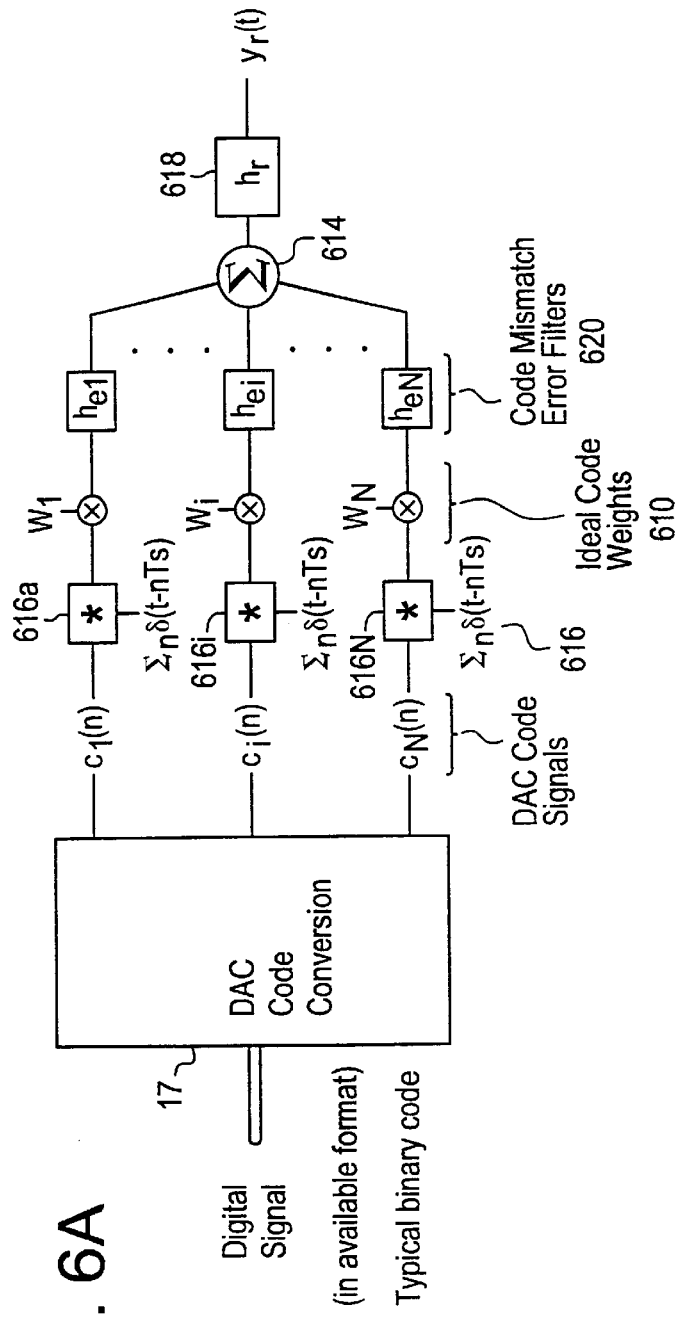
FIG. 6a is a simplified conceptual representation of the combination of static and dynamic DAC errors in the structure of FIG. 2, implementing the equation set forth in FIG. 6b.

FIG. 5a is a simplified analytical representation of a portion of the arrangement of FIG. 1, and more specifically of the code converter 17 (if used) and PROM 18, with PROM 18 preprogrammed by averager 20 and static DC level calibrator 22. In FIG. 5a, the individual codes at the output of code converter 17 (or at the output of multibit ΣΔ modulator 16 of FIG. 1, if code converter 17 is not used) are designated $c_1(n), \ldots, c_i(n), \ldots, c_N$. These codes $c_1(n), \ldots, c_i(n), \ldots, c_N$ are multiplied or weighted by idealized code weights $W_1, \ldots, W_i, \ldots, W_N$, respectively, by a set of multipliers designated generally as 510. The individual weighted codes $c_1(n)W_1, \ldots, c_i(n)W_i, \ldots, c_N W_N$ from set 510 of multipliers are then corrected by further multiplication by $(1+\epsilon_1), \ldots, (1+\epsilon_i), \ldots, (1+\epsilon_N)$, respectively, in a set of code mismatch error multipliers designated generally as 512, to produce multiplied output signals $c_1(n)W_1(1+\epsilon_1), \ldots, c_i(n)W_i(1+\epsilon_i), \ldots, c_N W_N(1+\epsilon_N)$. The multiplied output signals from set 512 of multipliers are summed together in a summing circuit or node illustrated as 516 of FIG. 5a, and the summed signals are applied to a block 516, representing modulation of the output signals from summing node 514 by an impulse function $\Sigma_n \delta(t-nTs)$. The modulated signals from block 516 are applied to a block 518, which is an output filter for signal reconstruction, which reconstructs the DAC output analog signal. The equation of FIG. 6b represents the operation of the arrangement of FIG. 6a. The arrangement of FIG. 6a, implementing the equation of FIG. 6b, corrects static errors, but cannot correct dynamic errors.

Within FIG. 5b, the equation for $y_r(t)$, which represents the analog output of DAC model of FIG. 6a, includes the term $W_i$, which represents a weight applied to a specific code sequence within the DAC structure. Three possible candidates for value $W_i$ can be used, which are for binary, thermometer, and level codes. The equations given for weight values are selected to correspond to the coding type selected within the DAC, which may be binary format in r-2r DACs, or thermometer in other types of DACs. Level code is provided in the equation in order to aid in modeling the thermometer code, but is not normally used within the actual DAC structure. Many DACs combine binary and thermometer coding in various arrangements (segmented DACs). The representation of FIG. 5a models only static DAC errors from amplitude misalignments of the actual DAC codes represented within the model as $\epsilon_i$.

Figure 2:
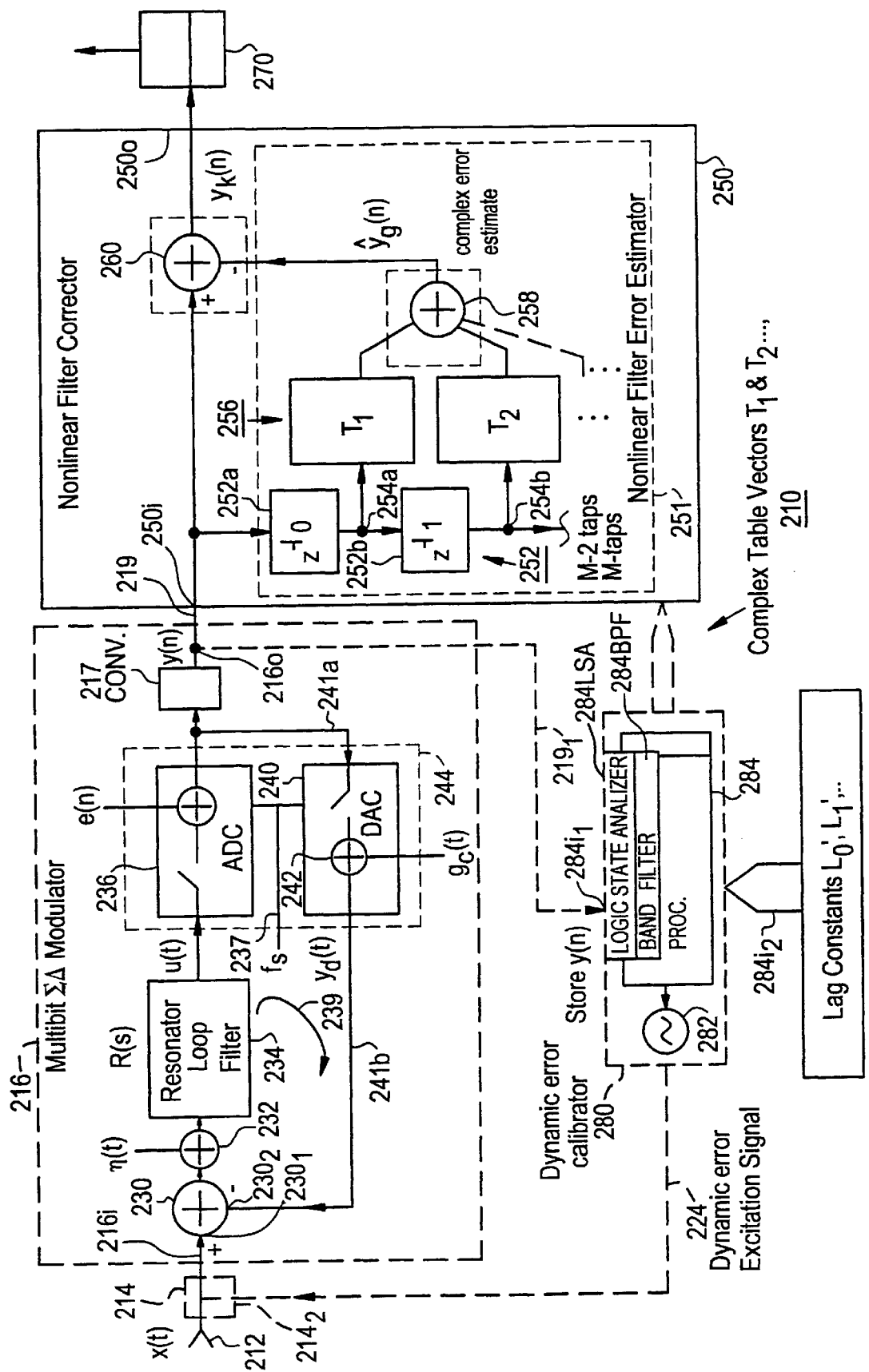
FIG. 2 is a simplified diagram, in block and schematic form, of an analog-to-digital converter according to an aspect of the invention.
Figure 3A:
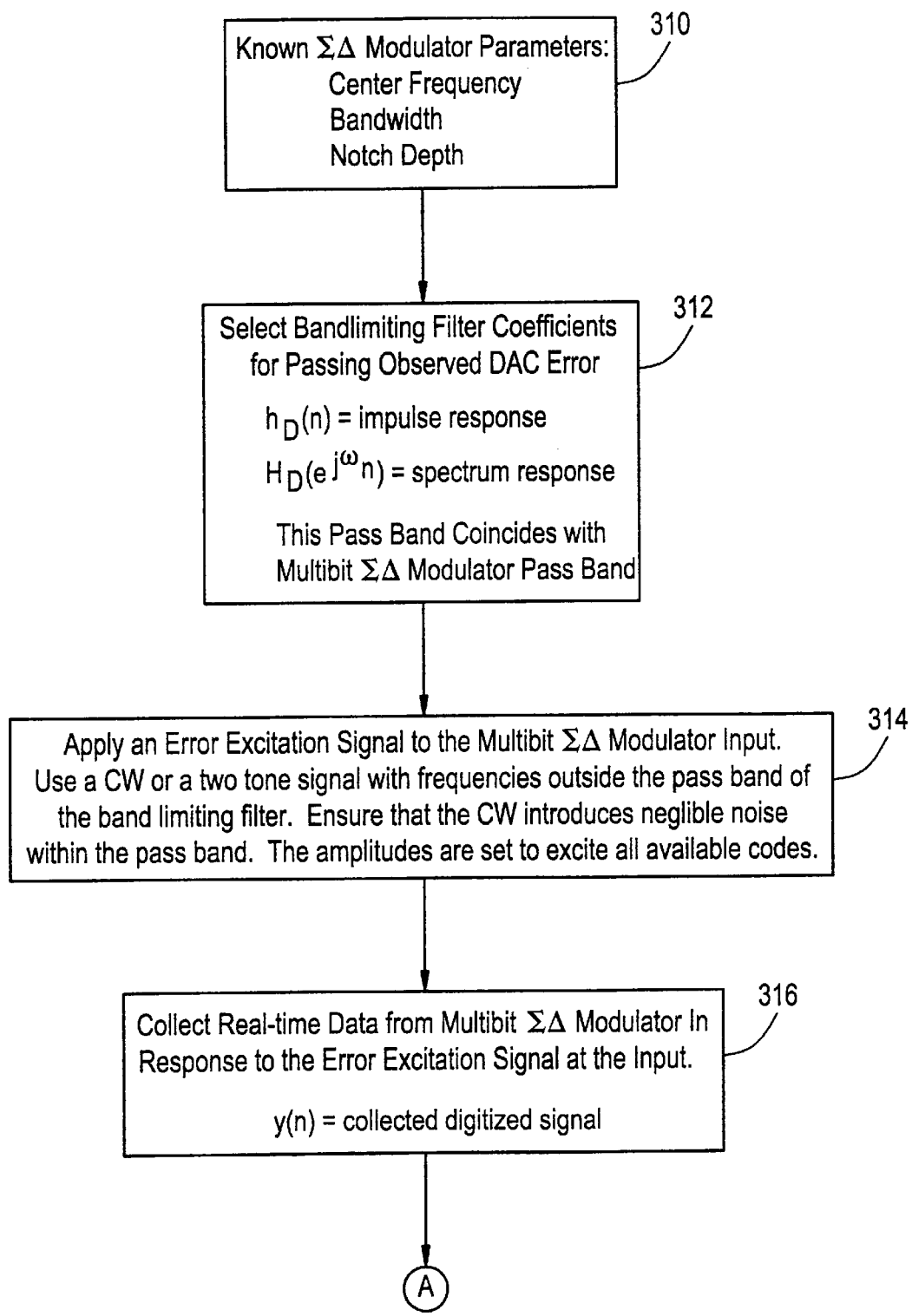
FIGS. 3a, 3b, 3c, 3d, and 3e together constitute a simplified flow chart setting out a method according to the invention for calibrating a nonlinearity filter, and for using the filter so calibrated for correcting the digital output of a sigma-delta analog-to-digital converter.
Figure 3B:
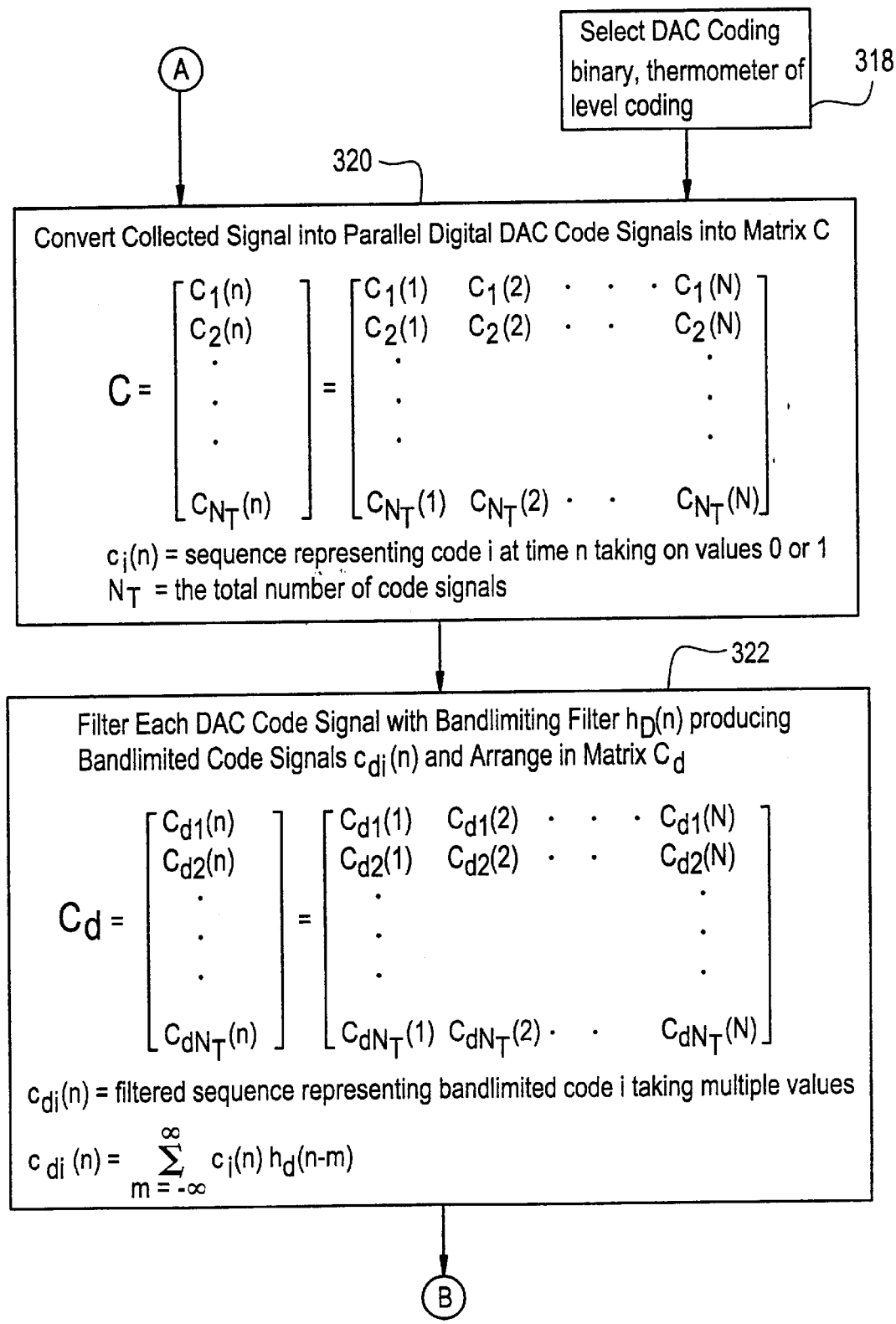
Figure 3C:
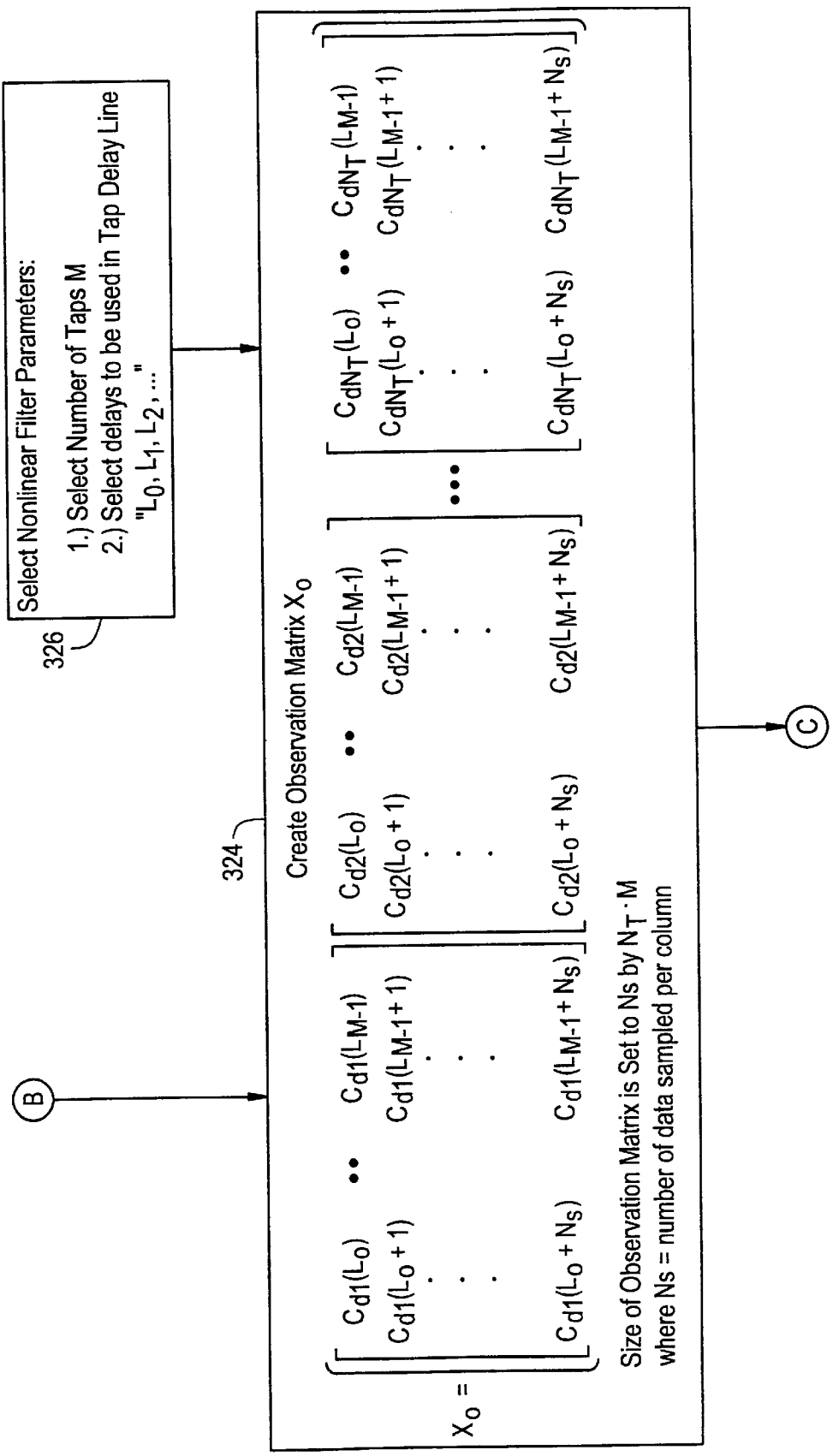
Figure 3D:
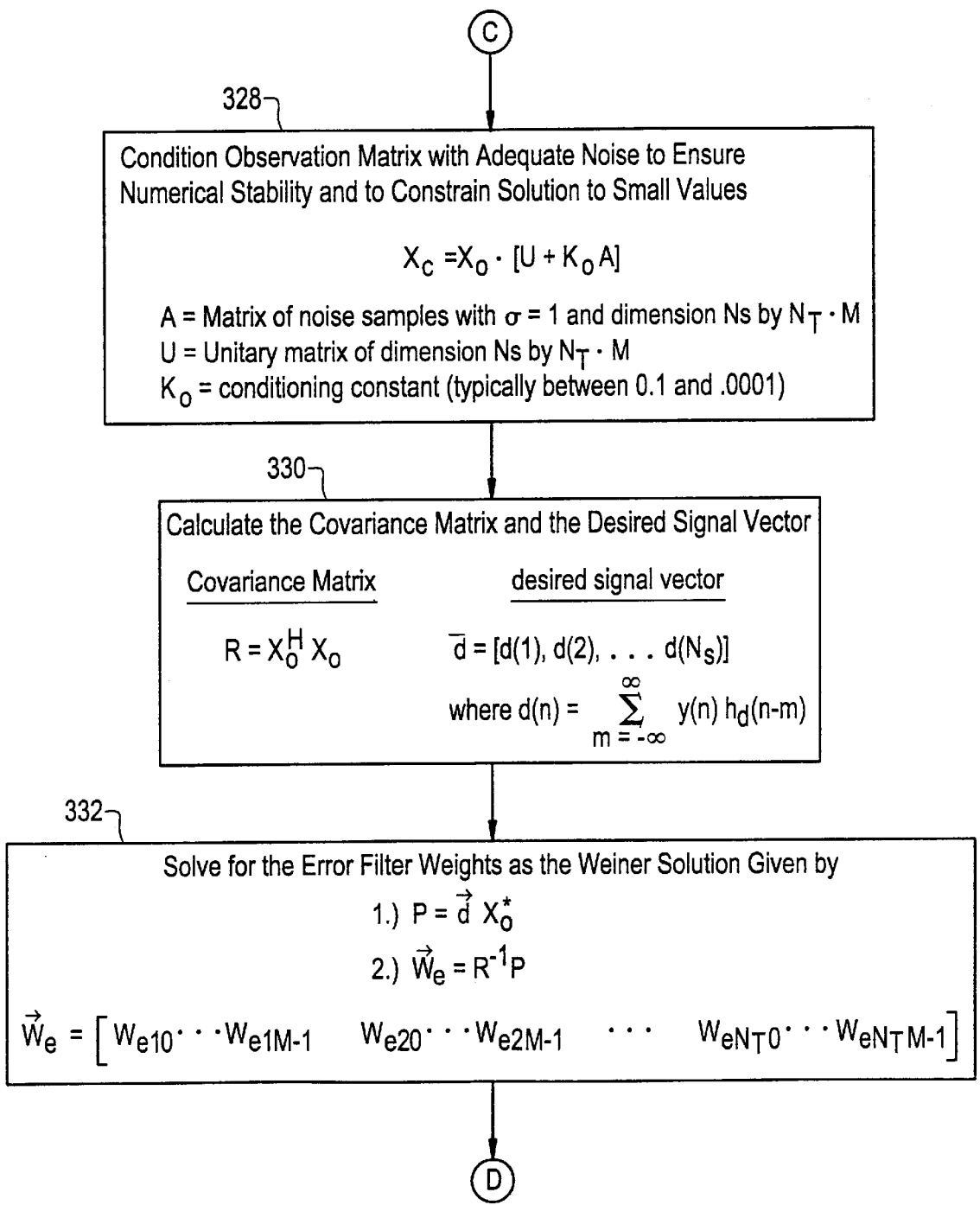
Figure 3E:
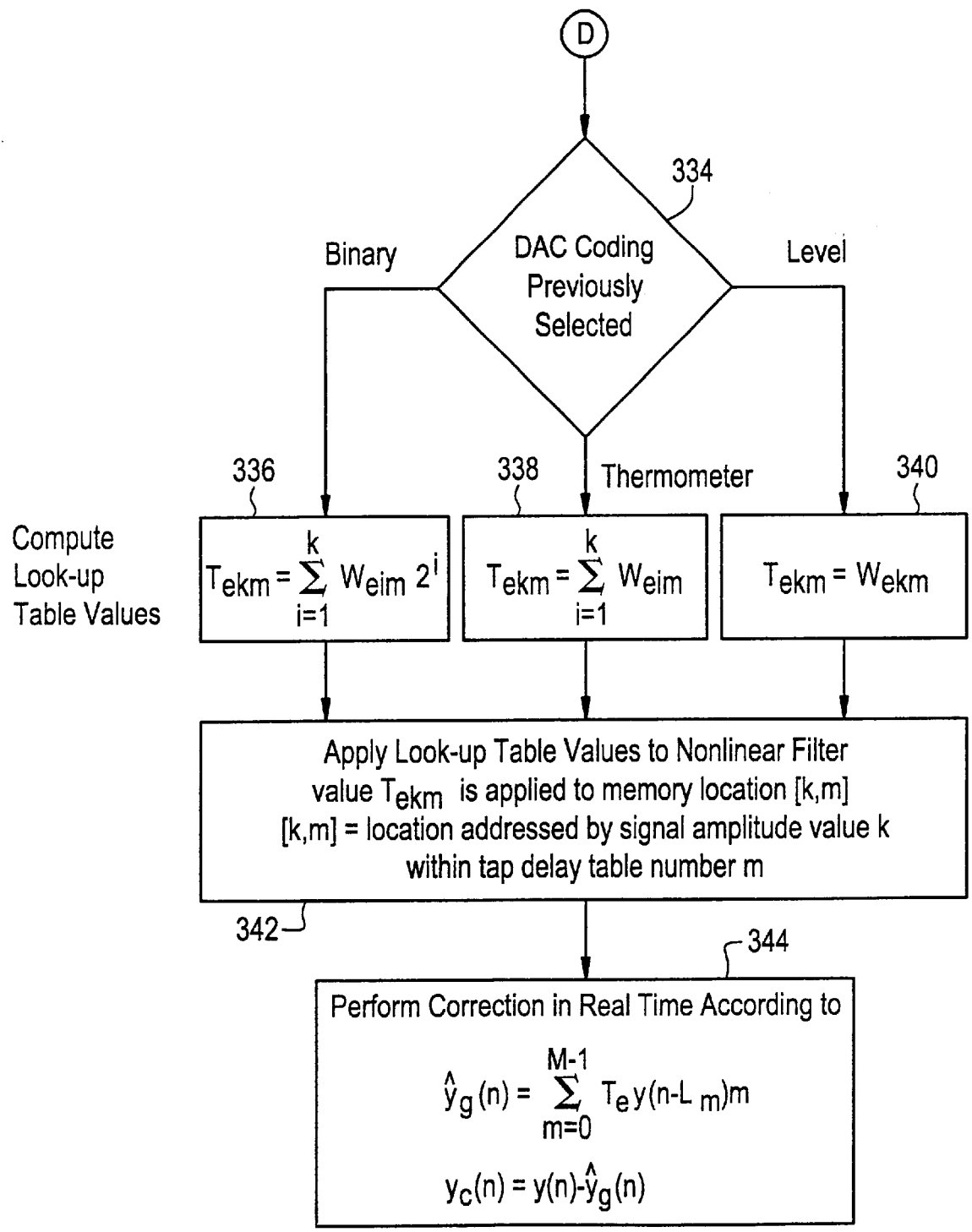

In FIG. 2, analog input signals applied to an input port 212 are converted into digital signals by an analog-to-digital converter (DAC) arrangement 210. Analog-to-digital converter 210 includes a multibit sigma-delta modulator 216, which is very much like multibit sigma-delta modulator 16 of FIG. 1 in form or topology, but which differs therefrom in a significant particular. In the arrangement of FIG. 2, analog input signals applied to input port 212 are coupled through a summing circuit 214 to the noninverting input port $230_1$ of a summing circuit 230, where they are summed with reconstructed analog signals y(t) applied to an inverting input port $230_2$ from a feedback path 239 including a DAC 240. The summed signals are applied to the input port 236i of an ADC 236 by way of a hypothetical summing circuit 232, corresponding to hypothetical summing circuit 32 of FIG. 1. The signals from summing circuits 230 and 232 of FIG. 2 are applied to a resonator 234. Resonator 234 may be of the type described in U.S. Pat. No. 5,392,042, issued Feb. 21, 1995 in the name of Pellon. The output signals u(t) from resonator loop filter 234 of FIG. 2 are applied to a multibit analog-to-digital converter 236, corresponding to ADC 36 of FIG. 1. Multibit ADC 236 (including code converter 217, if needed) converts the signals into multibit digital form y(n), and applies the signals so converted over a signal path 219 to an input port 250i of a nonlinear filter corrector designated generally as 250. The converted signals y(n) at the output of the multibit ADC 216 (and converter 217) are also applied, under certain conditions described below, over a signal path designated $219_1$ to a dynamic error calibrator 280.

Nonlinear filter corrector 250 of FIG. 2 compensates for some of the nonlinearities generated in the sigma-delta analog-to-digital converter 216 of FIG. 2. In particular, the nonlinearities which are corrected are those indicated as input g(t) which are effectively "injected" into the feedback path of multibit sigma-delta modulator 216, which feedback path includes signal path 241 and digital-to-analog converter 240. As mentioned above, these errors are not reduced by the closed loop of the converter, but instead undesirably modulate the digital output signal of the analog-to-digital converter (ADC) 236.

In FIG. 2, multibit digital signals applied over signal path 219 to nonlinear filter corrector 250 are coupled to the noninverting (+) input port of a summing circuit 260. According to an aspect of the invention, nonlinear filter corrector 250 includes a nonlinear filter error estimator 251. Nonlinear filter error estimator 251 includes a tapped delay line designated generally as 252, including M taps 254 separated by a corresponding number of delay elements 252a, 252b, . . . , each having delay designated by $z_{-10}$, $z_{-11}$, . . . . Tapped delay line 252 generates delayed versions of the digital output signal applied over signal path 219 to nonlinear filter corrector 250 from ADC modulator 216. In FIG. 2, M may be viewed as equaling two, so there are two delays actually illustrated, designated 252a and 252b, each terminating at a tap. More particularly, delay 252a terminates at a tap 254a, and delay element 252b terminates at a tap 254b. The outputs of taps 254a, 254b, and any other of the M taps, are coupled to a set 256 of corresponding lookup tables or addressable ROMs T1, T2, . . . , which are preprogrammed in a manner described below, to produce real and imaginary (or possibly I and Q) components, or possibly only real components, of an estimate of the noise signal g(t). Each of the lookup tables T1, T2, . . . of set 256 includes memory locations which, in general, are preprogrammed with real and imaginary components signals. The real and imaginary signals from the lookup tables are separately summed in a summing circuit illustrated as 258, to produce real components of an estimate of the noise signal g(t). The summed signals produced by summing circuit 258 represent the output signal of nonlinear filter error estimator 251. The summed signals produced by summing circuit 258 of nonlinear filter error estimator 251 are applied to an inverting (−) input port of a further summing circuit 260, The summed signals generated in summing circuit 258 of nonlinear filter error estimator 251, which represent the real and imaginary components of an estimate of the nonlinearity or error signals g(t), are applied to an inverting (−) input port of summing circuit 260, and are subtracted therein from corresponding components of the digital output signal of the sigma-delta modulator. This subtraction of the real and imaginary components of the estimated error signal g(t) reduces the error component of the output digital signal y(n) at output port 250o of nonlinear filter corrector 250. A decimating filter 270 is coupled to output port 250o to receive the output signals from nonlinear filter corrector 250, to eliminate out-of-band signal components.

The first delay element 252a of the tapped delay line 252 of the nonlinear filter corrector 250 of FIG. 2 preferably has a delay which is an approximation of the delay between (a) the point of injection of noise signal g(t) into the feedback signal path 239 of sigma-delta modulator 216 and (b) the output port 216o of the sigma-delta modulator 216. The feedback path 239 of sigma-delta modulator 216 includes path 241b, digital-to-analog converter 240, and noninverting input port $230_2$, and the delay path also includes summing circuit 230, resonator 234, and sigma-delta ADC 236. The other delay elements T2, . . . have delays which are determined by calculations based upon a set of measured sequential sigma-delta output samples when a sinusoidal input signal is applied at an out-of-band frequency, with an amplitude selected to exercise the full dynamic range of the sigma-delta modulator, all as described below. The content of the look-up tables is also determined by calculation from the abovementioned data.

In FIG. 2, the dynamic error calibrator 280 includes a low-noise oscillator 282, and a processor, logic state analyzer 284LSA, and bandpass filter 284BPF, illustrated together as a block 284. As described below, processor block 284 controls oscillator 282 during calibration, to cause oscillator 282 to produce a single carrier on one of the edges of the passband of the multibit sigma-delta modulator 216, as established by the resonator loop filter 234, or two carriers, one on each of the upper and lower edges of the passband. The oscillator signals are applied over a signal path 224 to input port $214_2$ of summing circuit 214, for injecting the oscillator signal into the signal flowing to the sigma-delta modulator 216. Multibit sigma-delta modulator 216 processes the calibration signals, and produces processed calibration signals at its output port 216o. Processed calibration signals in the form of multibit digital signals applied over signal path $219_1$ to first input port $284_{i1}$ of processor block 284, in conjunction with lag constants $L_0$, $L_1$, $L_2$, . . . , applied to input port $284_{i2}$. Lag constants $L_0$, $L_1$, $L_2$, . . . represent the known or predetermined delays of delay elements 252a, 252b, . . . , of FIG. 2. Processor block 284 receives the multibit digital signal at its input port $284_{i1}$ and the lag constants at its input port $284_{i2}$, and processes the data, to determine the values or weights which should program the various memory locations of look-up tables T1, T2, . . . of set 256 of look-up tables. It should be noted that the invention is not limited to particular delays of the delay elements T1, T2, . . . , but that improved performance is achieved over a wide range of delay values.

The flow chart of FIGS. 3a, 3b, 3c, 3d, and 3e represents the steps performed during calibration of the system of FIG. 2 by use of the dynamic error calibrator 280 of FIG. 2. The process represented by FIGS. 3a, 3b, 3c, 3d, and 3e includes process steps performed as operator inputs to the process, and also include automatic calculations performed by a processor. Put another way, the process is intended to be performed by an electronic processor, but certain operator inputs are needed before the processing can be performed.

The calibration process generally described above need not be performed continuously, but rather can be performed in the factory at the time the ADC is fabricated, or possibly at initial start-up in a particular application, or occasionally during use. In particular, recalibration should occur whenever the tuning of the loop filter 234 is changed, to choose different bandwidth or center frequency. It might also be desirable to recalibrate (or use pre-generated calibrations) at different operating temperatures of the ADC 210, to compensate for differences in errors which are attributable to the temperature of the active elements.

While the description above refers to use of both real and imaginary components of an estimate of the nonlinearity error signal, both real and imaginary components are used in order to achieve improved estimates of phase components of the nonlinearity, but real-only may be used in conjunction with simplified downstream processing, with adequate results. Typically, downconverters and decimation filters are used in the downstream processing. The downconversion for the case in which both real and imaginary components are used requires complex multiplication. When only real components are used, real multiplication can be used, thereby simplifying the down-converter. If downconversion is not used, the decimation filter may similarly be simplified when only real components are used. When the real-only estimates are used, the order of nonlinear filter corrector 250 of FIG. 2 is typically twice that of the case using both real and imaginary components. In this context, the term "order" means the number of taps and their corresponding tables; in the case illustrated in FIG. 2, the order is two, because there are only two delay-element/look-up table pairs, namely pair 252a/T1 and 252b/T2.

Figure 4:
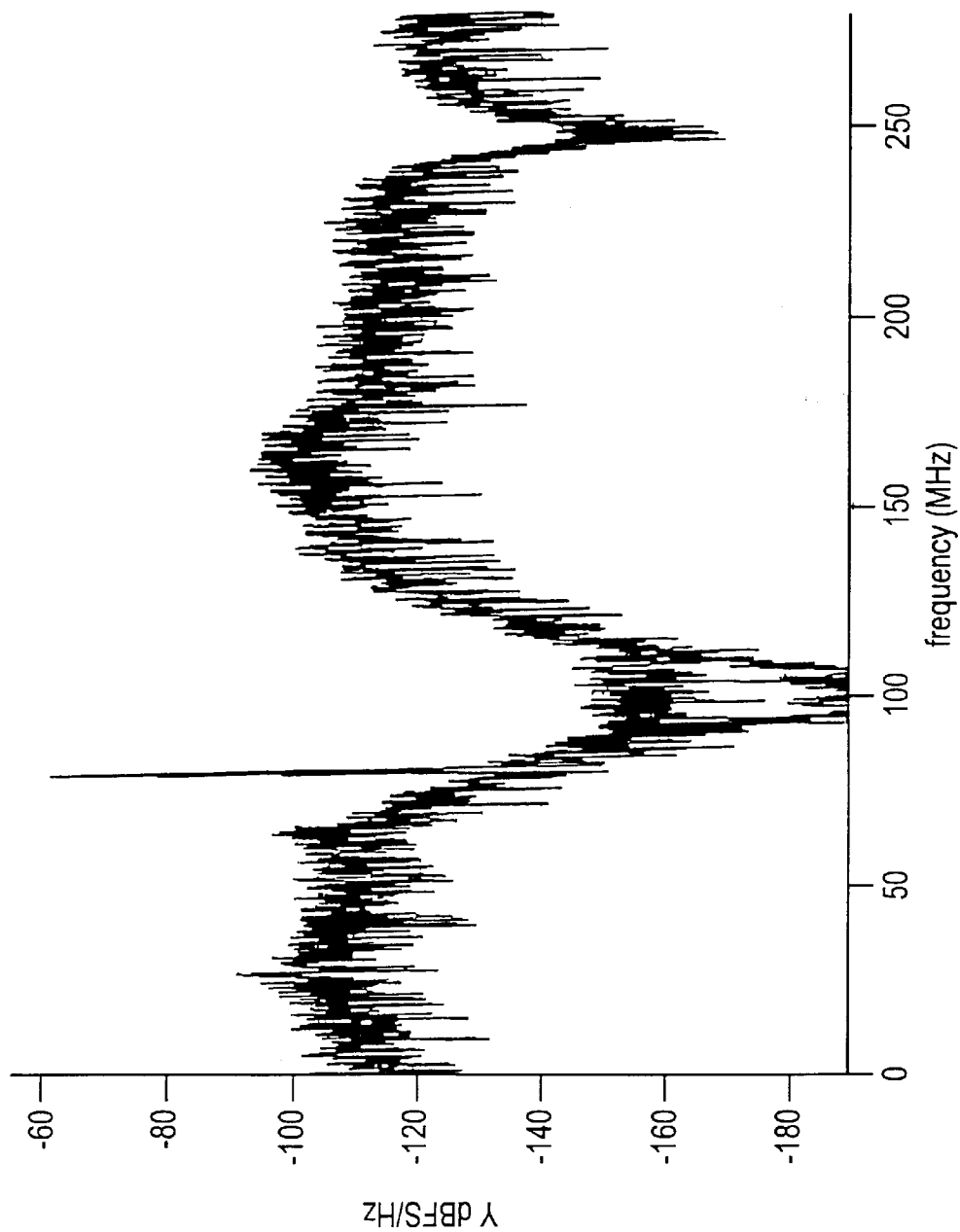
FIG. 4 illustrates plots of quantization and calibration noise as a function of frequency.

FIG. 4 illustrates two overlapping plots, which coincide over most of the illustrated frequency range, except in the range of about 95 to 105 Mhz. The lowermost or lower-amplitude of the plots of FIG. 4 represents the quantization noise over a range including the bandpass of the sigma-delta modulator 216 of FIG. 2. The lowermost plot of FIG. 4, which is a plot of quantization noise, has a region about 100 MHz. In the lowermost plot of quantization noise, the region around 100 MHz is affected by the resonator, which reduces the loop quantization noise to below –180 dB below full-scale/Hz, where full scale represents half the peak amplitude allowed by the converter from its center value. The upper plot of FIG. 4, which coincides with the lower plot except in the resonator notch around 100 MHz, represents the noise attributable to dynamic nonlinearity of DAC 244 of FIG. 2. In the particular example of FIG. 4, the DAC nonlinearities were simulated in a computer. The DAC error model used in the simulation included DAC cell reconstruction filters with mismatches in both group delay and amplitude, thereby representing dynamic error. In FIG. 4, the CW error excitation signal is represented by a peak at a frequency of about 80 MHz. The amplitudes of the error excitation signal(s) are selected to exercise or excite all the codes which represent levels out of the sigma-delta modulator 216; this requires a full-scale calibration signal; there must also be some offset between the frequency of the error excitation frequency which is nonsynchronous with the system clock frequency. Also, the error excitation signal must not itself introduce excessive noise within the passband; this can be guaranteed by use of a source with low phase noise, or by the use of an additional passband filter (not illustrated) at the output of generator 282 of FIG. 2.

As an aid to the understanding of the flow chart of FIGS. 3a, 3b, 3c, 3d, and 3e, reference is first made to FIGS. 6a and 6b. FIG. 6a is a simplified conceptual representation of the combination of static and dynamic DAC errors in the structure of FIG. 2, implementing the equation set forth in FIG. 6b. This is a more thorough model than FIG. 5a and the equation of FIG. 5b. In FIG. 6a, the DAC code (at the output of code conversion block 17, if used) is designated $c_1(n), \ldots, c_i(n), \ldots, c_N$, as in FIG. 6a. The DAC codes are individually modulated in a set 616 of modulator blocks $616_a, \ldots, 616_i, \ldots, 616_N$ by an impulse function $\Sigma_n \partial(t-nTs)$. The resulting modulated codes $c_1(n)\Sigma_n\partial(t-nTs), \ldots, c_i(n)\Sigma_n\partial(t-nTs), \ldots, c_N\Sigma_n\partial(t-nTs)$ are applied to a set of multipliers designated generally as 610 for multiplication or weighting by idealized code weights $W_1, \ldots, W_i, \ldots, W_N$, respectively, to produce modulated, weighted individual codes $c_1(n)\Sigma_n\partial(t-nTs)W_1, \ldots, c_i(n)\Sigma_n\partial(t-nTs)W_i, \ldots, c_N\Sigma_n\partial(t-nTs)W_N$. Each modulated, weighted, individual code is filtered by a set of mismatch or code reconstruction filters, designated together as 620, each having impulse response given by $h_{re1}, \ldots, h_{rei}, \ldots, h_{reN}$, respectively. The mismatches may be represented as changes in gain, delay, phase, andor spectral response. These mismatches represent total error, including both static and dynamic error. The modulated, weighted, and filtered individual codes are summed at a summing node 614 of FIG. 6a, to produce the desired analog reconstructed signal $y_r(t)$ including static and dynamic errors.

Figure 7:
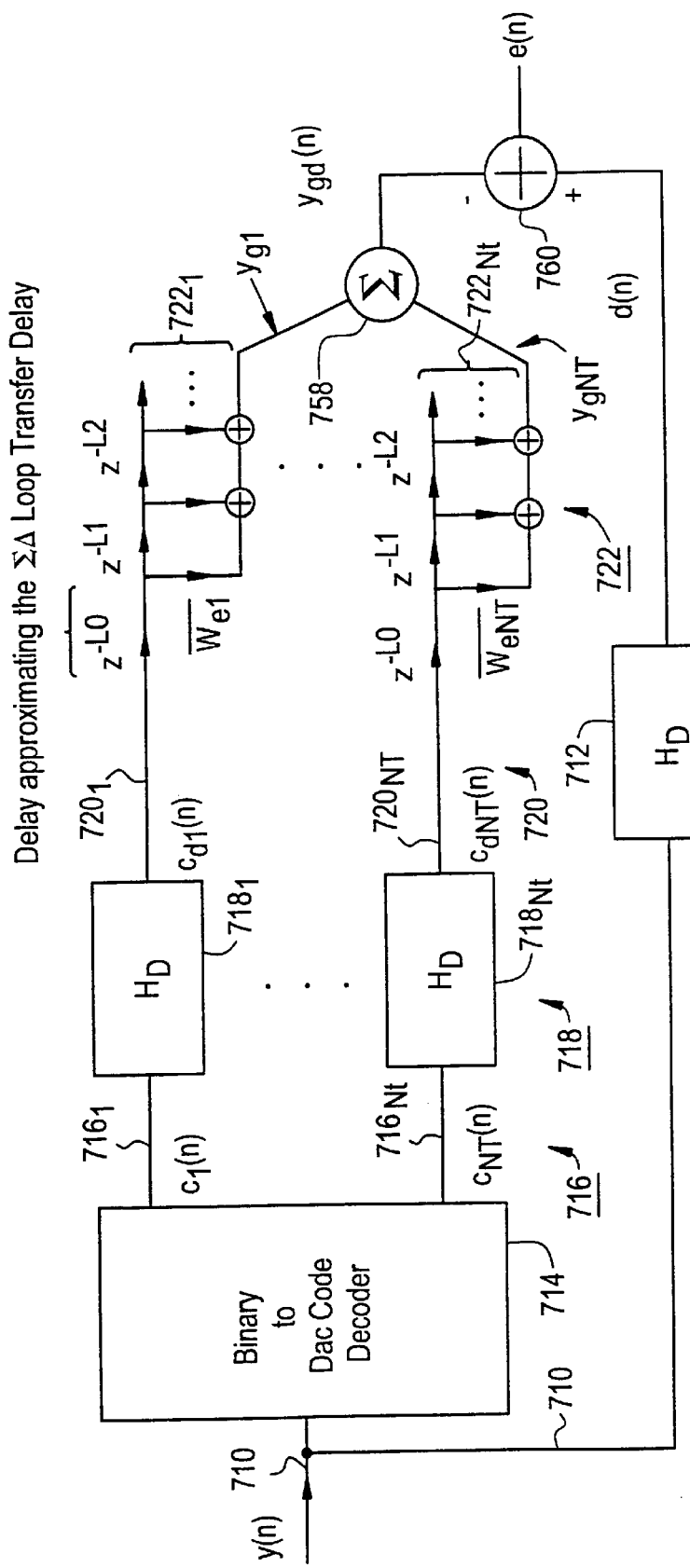
FIG. 7 is a simplified conceptual block diagram representing the processing which is performed in the dynamic error calibrator of FIG. 2 in order to determine the coefficients for the look-up tables.

FIG. 7 is a simplified conceptual block diagram representing the processing which is performed in dynamic error calibrator 280 of FIG. 2 in order to determine the coefficients for the look-up tables of set 256. In FIG. 7, the converted code y(n) produced at the output port 236 of FIG. 2 is applied over a signal path 710 to a digital filter 712 and to a binary-to-DAC-code converter 714. Digital filter 712 has characteristic $H_D$, which is a low-pass or bandpass characteristic, for passing the DAC error within the band of interest, and for attenuating components outside the band of interest. Code converter 714 performs the reverse of the code transformation performed by code converter 217 of FIG. 2, to produce a plurality of codes $c_1(n), \ldots, c_{Nt}(n)$ on output signal paths $716_1$ through $716_{Nt}$, respectively, of a signal path set 716. Each individual code on a signal path of set 716 is filtered by a corresponding filter $718_1, \ldots, 718_{Nt}$ of a set 718 of filters, each having filter characteristic $H_D$. The output weight of each $H_D$ filter $718_1, \ldots, 718_{Nt}$ of set 718 is a bandlimited code signal $C_{di}(n)$, which is applied over a signal path $720_i$ of a set 720 of signal paths to a set 722 of transversal filters $722_1, \ldots, 722_{Nt}$. Each one of transversal filters $722_1, \ldots, 722_{Nt}$ includes delays variously designated as $z^{-L0}, z^{-L1}, z^{-L2}, \ldots$, where $z^{-1}$ represents an incremental delay equal to one clock interval and where the values $L_0, L_1, L_2, \ldots$ are the delays of the delay elements of set 252 of FIG. 2. The delays are selected to correspond to the delays used in the nonlinear filters of set 252 of filters of FIG. 2. The weights $W_{ei}$ represent FIR filter weights which multiply the tapped delayed signals. In relation to code weights $W_{ei}=[W_{ei0}, W_{ei1}, W_{ei2}, \ldots, W_{eiM-1}]$, first index i represents the signal paths corresponding to 720, and the second index, which progresses from 0 to M−1, represents the weights applied to tapped signals from the tapped delay line. The filtered outputs $y_{g1}$ through $y_{gnt}$ from the plurality of transversal filters of set 722 are applied to a summing circuit or node 758, in which they are summed together to generate a representation or estimate of the errors $y_{gd}(n)$ in the output of multibit ΣΔ modulator 216 of FIG. 2. Each of these signals $y_{gi}(n)$ represents estimates of errors contributed by each code sequence to the total error $y_{gd}(n)$. The estimated errors $y_{gd}(n)$ generated at the output of summing node 758 are applied to the inverting (−) input port of summing circuit 760, to produce the corrected multibit digital signal e representative of the analog signal applied to input port 212 of FIG. 2.

The block diagram of FIG. 7 suggests an optimization criterion in which the desired signal d(n) minus $y_{gd}(n)$ produces an error e(n) which is minimized by appropriate selection of weights $W_{ei}=[W_{ei0}, W_{ei1}, W_{ei2}, \ldots, W_{eiM-1}]$. The selection of the weights may be obtained by a least-squares solution, described in conjunction with the flow chart of FIGS. 3a, 3b, 3c, 3d, and 3e.

In the flow chart of FIGS. 3a, 3b, 3c, 3d, and 3e, the process or logic (hereinafter logic) starts at a block 310, which represents obtainance of certain properties of the multibit sigma-delta modulator 216 of FIG. 2, namely the center frequency of the passband, the bandwidth, and the notch depth provided by the resonator 234 acting within the feedback loop of the sigma-delta modulator 216. This information can be obtained by measurements performed on a hardware apparatus or by the setting of coefficients in a software embodiment. From block 310, the logic flows to a further block 312, which represents the setting of coefficients within digital software-implemented bandlimiting filter 284BPF of processor 284 of FIG. 2, so that only the error components of the output signal of sigma-delta modulator 216, flowing over signal path $219^1$ to the processor 284, are stored within memories (logic state analyzer 284LSA) associated with the processor for further use. Those skilled in the art know that a logic state analyzer may be used in association with processor 284 for synchronously capturing the samples, and for storing them in memory for later use by processor 284. More particularly, block 312 represents selection of $h_D(n)$, which are finite impulse response (FIR) values, as the coefficients of the bandlimiting filter 284BPF within processor 284. The digital filter may also be implemented as an IIR filter, but this is not the preferred form of the filter. Selection of these coefficients produces a spectral response $H_D(e^{jwn})$ which coincides with the passband of the multibit sigma-delta modulator 216. The stop-band response of bandlimiting filter 284BPF is selected to attenuate the quantization noise at the output of sigma-delta modulator 216 to a level which makes the quantization noise negligible relative to the noise components within the passband, and to attenuate the error excitation signals (those generated by oscillator 282 of FIG. 1) at selected frequencies outside the passband (the continuous-wave or CW calibration signals lie in notches in the filter response). The order of bandlimiting filter 284BPF may typically range from 100 to 600.

From block 312 of FIGS. 3a, 3b, 3c, 3d, and 3e, the logic flows to a further block 314, which represents energization of the oscillator(s) 282 of FIG. 2 to produce the CW error excitation signal, which is applied over signal path 224 to input port $214_2$, and which flows through the multibit sigma-delta modulator 216 to output port 216o, and back to the dynamic error calibrator 280 by way of signal path $219_1$. As mentioned above, the error excitation signals are selected to be just outside the passband of the band limiting filter, each in its own notch.

From block 314 of FIGS. 3a, 3b, 3c, 3d, and 3e, the logic flows to a block 316, which represents collection of real-time responses by the logic state analyzer portion 284LSA of calibrator 280 of FIG. 2, i.e. the catching and storing of the output signals from sigma-delta modulator 216. The data so collected for later use is designated y(n). From block 316 of FIGS. 3a, 3b, 3c, 3d, and 3e, the logic flows by way of a logic node A to a further block 320. The type of DAC coding is selected in a block 318 prior to further operations; the type of coding is a known parameter of the processing in sigma-delta modulator 216. Included within the possible types of coding are binary codes and thermometer codes.

Block 320 of FIGS. 3a, 3b, 3c, 3d, and 3e represents a portion of the processing performed in processor block 284 of FIG. 2. More particularly, block 320 of FIGS. 3a, 3b, 3c, 3d, and 3e represents the conversion of the data collected in block 316 into parallel digital DAC code signals, arranged as a matrix C, which is set forth in block 320. Matrix C represents the code of samples y(n) (on signal path $219_1$ of FIG. 2), converted into a code corresponding to the code which DAC 240 of FIG. 2 receives over signal path 241a to produce reconstructed analog signals on signal path 241b. Put another way, matrix C represents the output of code conversion block 217 of FIG. 2, "back-converted" into the original coding state at the input port of code conversion block 217. As mentioned above, this original coding state may be binary, thermometer, or possibly some other type of code. In general, the multibit sigma-delta modulator 216 of FIG. 1 produces ordinary binary code at its output port 216o; if DAC 240 also uses ordinary binary code, no actual code converter 217 is required in FIG. 2, and no code conversion is required in block 320 of FIGS. 3a, 3b, 3c, 3d, and 3e, because the converted code is the same as the incoming code. Most commonly, the DAC coding will be thermometer coding. Such thermometer coding can be directly coupled to DAC 240 from comparators (not illustrated) within ADC 236.

In the elements of matrix C of block 320 of FIGS. 3a, 3b, 3c, 3d, and 3e, the numeric subscripts represent the particular stream of data which the sample represents in the back-converted code (that is, in the thermometer or other code flowing between ADC 236 and DAC 240), and the numeral in parentheses represents the time at which the sample occurs. Put another way, the rows of the matrix C represent one of the parallel streams of converted data, which is to say, if there are N parallel streams of data in the multibit input signal applied to DAC 240 of FIG. 2, each row of matrix C represents samples from a single such stream, and there must be N rows in matrix C. Only when the code of the multibit output of sigma-delta modulator 216 is the same as the code used by DAC 240 (that is, when no code converter 217 is used) will the number N necessarily be equal in the source and converted data. Each element of matrix C of FIGS. 3a, 3b, 3c, 3d, and 3e is a single digit, which may take on values of zero (0) or one (1). Matrix C represents the stimulus into each of the cells (not separately illustrated) within DAC 240 of FIG. 2, in the presence of the CW excitation signal.

From block 320 of FIGS. 3a, 3b, 3c, 3d, and 3e, the logic flows to a block 322, which represents the step of filtering the signals of the set of DAC codes represented by matrix C with the bandlimiting filter 284BPF associated with dynamic error calibrator 280 of FIG. 2. More particularly, the DAC codes represented by matrix C of block 320 are filtered by function $h_D(n)$. The result of this filtration is the production of bandlimited code signals $c_{di}(n)$, which can be represented by matrix $C_d$, which matrix is set forth in block 322 of FIGS. 3a, 3b, 3c, 3d, and 3e. Each of the elements of matrix $C_d$ is identified by a subscript numeral and a parenthetical suffix, having the same meanings ascribed to the subscripts and suffixes of matrix C. The signals represented by matrix $C_d$ are the individual spectral contributions of each code sequence produced by DAC 240 and contributed to the band of interest, which is the passband of the bandlimiting filter 284BPF. While the unfiltered codes take on values of only one and zero, the filtered codes can take on values other than zero and one. The noise shaping of the sigma-delta modulator produces a correlation between the filtered code sequences represented in matrix $C_d$ such that the sum of these code sequences produces a signal sequence smaller, and preferably much smaller, in power than each individual code sequence; in other words, the summation of a plurality of code sequences, each having a standard deviation of 0.1, for example, may have the result of producing a summed signal with a standard deviation of 0.001.

From block 322 of FIGS. 3a, 3b, 3c, 3d, and 3e, the logic flows by way of a logic node B to a block 324, which represents creation of an observation matrix $X_0$. The logic of block 324 of FIGS. 3a, 3b, 3c, 3d, and 3e requires the information relating to the number of taps M and the magnitudes of the delays in the tapped delay line 252 of FIG. 2, as set forth in block 326; this information must be provided before the operation of block 324 of FIGS. 3a, 3b, 3c, 3d, and 3e can begin. Observation matrix $X_0$ produced in block 324 organizes the available data from matrix $C_d$ for solution to determine the required look-up table values which are required in tables T1, T2, ... of set 256 of look-up tables of nonlinear filter error estimator 251 of nonlinear filter corrector 250 of FIG. 2. Matrix $X_0$ includes $N_T$ submatrices, corresponding to the number of codes $N_T$ in the backconverted data $C_d$. Each sub-matrix has (vertical) height equal to the number of samples $N_s$, and (horizontal) width equal to the number of taps M in the delay line 252 of FIG. 2. Only the first, second, and last submatrices of matrix $X_0$ are illustrated in block 324 of FIGS. 3a, 3b, 3c, 3d, and 3e. In matrix $X_0$ of block 324, the subscript portion of each element of each submatrix has the same meaning as in matrix $C_d$, and the parenthetical suffixes, such as "$(L_0+1)$", represent the transformed locations of the elements. The data in the observation matrix is arranged in a regular pattern in which each code will have multiple adjacent columns of data within $X_0$, with each column representing a set of samples in time of each converted code, with lag corresponding to one selected lag or delay. The lags ($L_x$) represent the delays of the delay elements 252x of FIG. 2.

As mentioned, matrix $X_0$ of block 324 of FIGS. 3a, 3b, 3c, 3d, and 3e consists of a plurality of sub-matrices, arrayed or set horizontally, of which only the first, second, and last sub-matrices are illustrated. Each sub-matrix of matrix X represents the data of one of the plurality of codes appearing on signal path 219 of FIG. 2. In matrix $X_0$, the first or left-most sub-matrix includes a plurality of columns of data, arrayed horizontally. A column of data of matrix $X_0$ represents a particular lag provided by the delay elements 252 of FIG. 2, and for each lag, there is a corresponding column of data. The left-most column of data of the first sub-matrix of matrix $X_0$ includes a vertical array of elements, ranging from the first element $C_{di}(L_0)$ at the top of the column to the last element $C_{di}(L_0+N_s)$ at the bottom; only the first, second, and last elements of the first column are illustrated. In the first column of the first sub-matrix of matrix $X_0$, the first element $C_{d1}(L_0)$ represents the earliest sample of the first filtered code (code 1), delayed by the first delay element (252a of FIG. 2), the second element from the top, $C_{d1}(L_0+1)$ represents the next succeeding sample of filtered code 1, also delayed by first delay element 252a. The remainder of the first column of the left-most submatrix of matrix $X_0$ of FIGS. 3a, 3b, 3c, 3d, and 3e represents all the later samples of code 1 delayed by first delay element 252a, until the last or $N^{th}$ sample $C_{d1}(L_0+N_s)$, which appears at the bottom of the first column of the first sub-matrix. The next or second column of the first sub-matrix (not illustrated), represents the same code 1, delayed by the sum of the delay of the next delay element and all previous accumulated delays, which in the case of column 2 represents the summation of the delays of both first and second delay elements 252a and 252b of FIG. 2. The last or right-most column in the first or left-most sub-matrix of matrix $X_0$ represents the same code 1, delayed by the summation of all the delays 252, including the last or (M−1)$^{th}$ of the delay elements of FIG. 2.

Similarly, the left-most column of data of the second sub-matrix of matrix $X_0$ (the second sub-matrix from the left) of block 324 of FIGS. 3a, 3b, 3c, 3d, and 3e includes a vertical array of elements, ranging from the first element $C_{d2}(L_0)$ at the top of the column to the last element $C_{d2}(L_0+N_s)$ at the bottom; only the first, second, and last elements of the first column of the second sub-matrix are illustrated. In the first column of the second sub-matrix of matrix $X_0$, the first element $C_{d2}(L_0)$ represents the earliest sample of the second filtered code (code 2), delayed by the first delay element 252a, the second element from the top, $C_{d2}(L_0+1)$ represents the next succeeding sample of filtered code 2, also delayed by first delay element 252a. The remainder of the first column represents all the later samples of code 2 delayed by first delay element 252a, until the last or N$^{th}$ sample $C_{d2}(L_0+N_s)$, which appears at the bottom of the first column of the second sub-matrix. The next or second column of the second sub-matrix (not illustrated), represents the same code 2, delayed by the sum of the delay of the next delay element and all previous accumulated delays, which in the case of column 2 represents the summation of the delays of both first and second delay elements 252a and 252b of FIG. 2. The last or right-most column in the second sub-matrix of matrix $X_0$ represents the same code 2, delayed by the summation of all the delays 252, including the last or (M−1)$^{th}$ of the delay elements of FIG. 2.

The left-most column of data of the last or N$^{th}$ sub-matrix of matrix $X_0$ (the last sub-matrix from the left, or the right-most submatrix) of block 324 of FIGS. 3a, 3b, 3c, 3d, and 3e includes a vertical array of elements, ranging from the first element $C_{dNT}(L_0)$ at the top of the column to the last element $C_{DNT}(L_0+N_s)$ at the bottom; only the first, second, and last elements of the first column of the last sub-matrix are illustrated. In the first column of the last sub-matrix of matrix $X_0$, the first element $C_{DNT}(L_0)$ represents the earliest sample of the N$^{th}$ filtered code (code $N_T$), delayed by the first delay element 252a, the second element from the top, $C_{DNT}(L_0+1)$ represents the next succeeding sample of filtered code $N_T$, also delayed by first delay element 252a. The remainder of the first column represents all the later samples of code $N_T$ delayed by first delay element 252a, until the last or N$^{th}$ sample $C_{DNT}(L_0+N_s)$, which appears at the bottom of the first column of the last sub-matrix. The next or second column of the last sub-matrix (not illustrated), represents the same code $N_T$, delayed by the sum of the delay of the next delay element and all previous accumulated delays, which in the case of column 2 represents the summation of the delays of both first and second delay elements 252a and 252b of FIG. 2. The last or right-most column in the last sub-matrix of matrix $X_0$ represents the same code $N_T$, delayed by the summation of all the delays 252, including the last or (M−1)$^{th}$ of the delay elements of FIG. 2.

From block 324 of FIGS. 3a, 3b, 3c, 3d, and 3e, the logic of the calibration flows, by way of a logic node C, to a block 328, which represents conditioning of the observation matrix $X_0$ with noise, to assure numerical stability (to eliminate non-convergence of the mathematical processing). The conditioning with noise is also required to constrain the solution to small table values. This constraint eliminates the possibility of producing a nonlinear filter that cancels the desired signal. The conditioning is accomplished by addition of noise to the elements of the observation matrix $X_0$ in the following manner. A preferred method of introducing noise is to multiply the observation matrix $X_0$ by a similarly dimensioned matrix in which each element is made up of the value unity plus a scaled random variable. More particularly, the conditioned observation matrix is $X_c=X_0(U+K_0A)$, where U is a unitary matrix of dimension $N_s$ by $(N_T \times M)$, A is a matrix of noise samples with $\sigma=1$ and dimensions of $N_s$ by $(N_T \times M)$, and $K_0$ is a conditioning constant, typically having values lying between 0.1 and 0.0001.

The logic flows to a block 330 from block 328 of FIGS. 3a, 3b, 3c, 3d, and 3e. Block 330 represents calculation of the covariance matrix R and the desired-signal vector . The covariance matrix $R=(X_0^H)(X_0)$, where $X_0^H$ is the complex conjugate transpose of $X_0$. The desired-signal vector=[d(1), d(2), ..., d($N_s$)], where the square bracket denotes a vector, and the desired signal represents the DAC error over the passband of the bandlimiting filter 284BPF. The elements of vector are given by $$d(n) = \sum_{m=-infinity}^{infinity} y(n)h_d(n-m)$$

From block 320 of FIGS. 3a, 3b, 3c, 3d, and 3e, the logic of the calibration flows to a block 332, which solves for the error filter weights. The solution is performed as a standard Weiner solution as set forth in block 332. The first step in the processing of block 332 is to create vector P by multiplication of vector with the complex conjugate of matrix $X_0$. Vector P represents the cross-correlation between the desired signal vector and the observations represented by $X_0$. Then, the vector $W_e$ is calculated as the product of the inverse of covariance matrix R and matrix P. The vector $W_e$ will have elements comprising the coefficients of the error filter, and arranged in sets corresponding to each code index. As shown in block 332 of FIGS. 3a, 3b, 3c, 3d, and 3e, the first set of coefficients, ranging from $W_{e0}$ to $W_{e1M-1}$ will correspond to the error filter coefficients of code 1 for each of the accumulated delays, which in turn correspond to each of the look-up tables. A second set of elements $W_{e20}$ to $W_{e2M-1}$, similarly corresponding to the error filter coefficients for code 2 for each of the accumulated delays, is concatenated with the first set of elements. Thus, each of the elements of vector $W_e$ corresponds to the coefficients for one of the look-up tables T1, T2 of set 256. From logic block 332 of FIGS. 3a, 3b, 3c, 3d, and 3e, the logic flows by way of a logic node D to a further decision block 334, which represents selection of that one of the previously identified DAC coding schemes, namely binary, thermometer, or level, whereupon the logic flows to a corresponding one of blocks 336, 338, or 340, respectively.

Blocks 336, 338, and 340 of FIGS. 3a, 3b, 3c, 3d, and 3e represent the generation of the look-up table values $T_{ekm}$ by various equations, which are set out in the blocks. From any one of blocks 336, 338, or 340, the logic flows to a block 342, which represents application of the table look-up values $T_{ekm}$ to the appropriate memory locations k,m in the look-up tables of set 256 of FIG. 2, where k,m is the location addressed by signal amplitude value k within that look-up table associated with tap delay number m. The equations in the boxes provide translation of the values in vector $W_e$ to values in the table $T_{ekm}$.

Block 344 of FIGS. 3a, 3b, 3c, 3d, and 3e represents operation of the analog-to-digital converter 210 of FIG. 2 to generate digital signals with real-time correction for dynamic DAC errors, using the look-up tables of set 256 of FIG. 2 loaded with the values as explained above to generate the corrected digital values $y_c(n)=y(n)-y_g(n)$, where $y_g(n)$ is determined as set forth in block 344.

Figure 8:
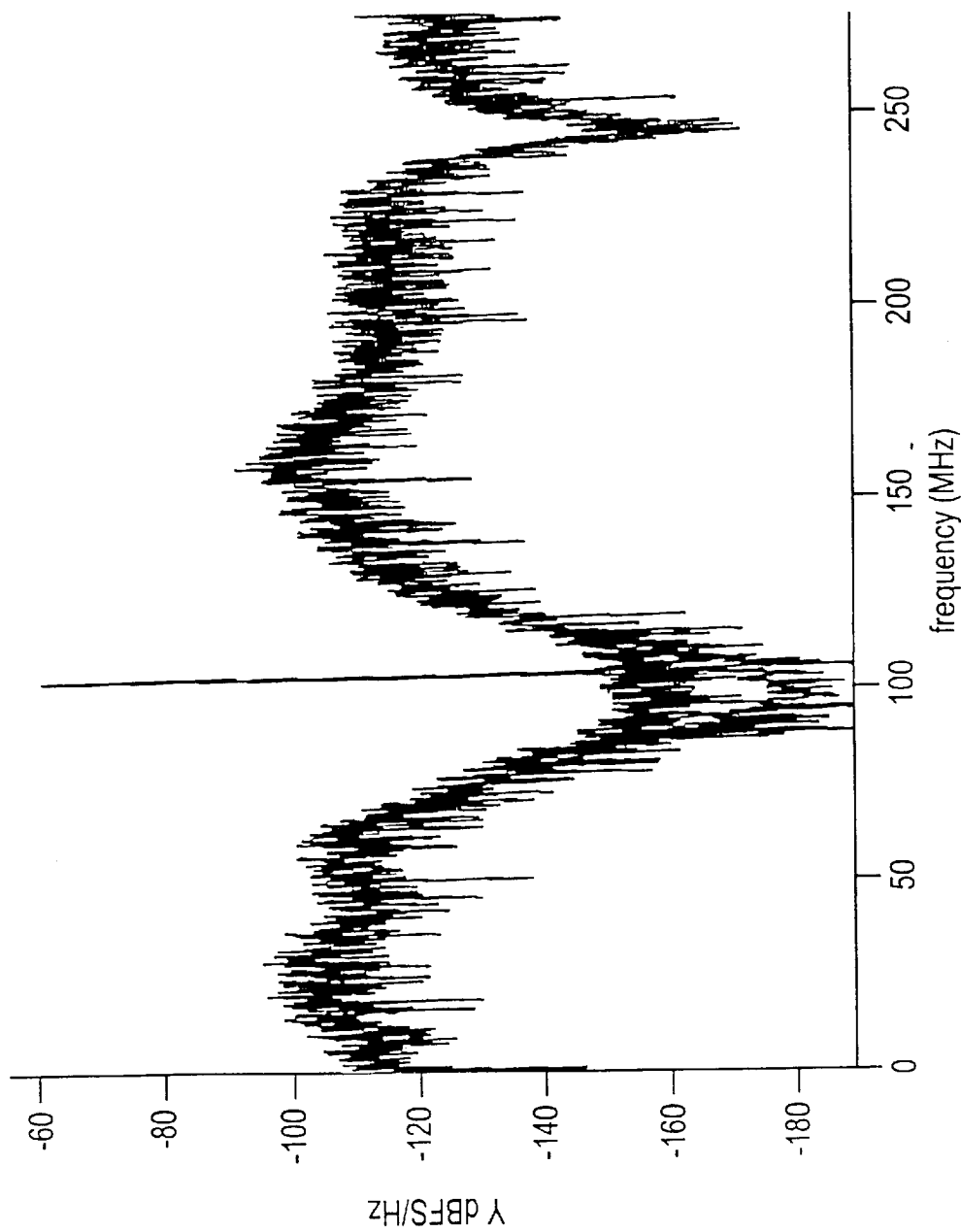
FIG. 8 represents spectral plots of uncorrected digital signals and corrected digital signals.

FIG. 8 includes two superposed plots as in FIG. 4 showing the resulting output $y_c(n)$ produced by the ADC 210 of FIG. 2 including nonlinear filter correction for both static and dynamic errors as described above. In FIG. 8, the signal applied to the converter is represented by the sharp peak or spectral line within the passband of the sigma-delta modulator, and this spectral line appears on both the upper and the lower plots within the passband of 95 to 105 MHz. The upper plot represents the uncorrected signal y(n) generated at output port 219 of the multibit sigma-delta modulator 216 of FIG. 2, and the lower plot represents the corrected output signal $y_c(n)$ at output port $250_o$ of nonlinear filter corrector 250 of FIG. 2. As can be seen, the corrector according to the invention, in this embodiment, improves the dynamic range by about 20 dB.

Other embodiments of the invention will be apparent to those skilled in the art. For example, while look-up tables T1 and T2 of set 256 have been described as being ROMs, they are read-only in the context of normal (non-calibration) operation; the look-up tables are preferably controllable memories such as RAM, so that the calibration procedure can be readily invoked at initial turn-on or at any other time. Various portions of the arrangement of FIG. 2 may be in the form of hardware, firmware, or software. While specific frequencies of operation have been mentioned, the invention does not depend on operation at these frequencies, or on operation at higher or lower frequencies than those mentioned, as the benefit to be derived depends not only on the operating frequency, but also on other factors, such as the design of, and technology used in, any hardware associated with the analog-to-digital converter. While signals have been described as being variously applied to inverting or noninverting input ports of summing circuits, those skilled in the art realize that the same effect can be achieved by appropriate selection of the polarity of the applied signal in conjunction with the nature of the port. Where look-up tables are described, these may be ROM. PROM, RAM, or the like.

Thus, an analog-to-digital converter (210) according to an aspect of the invention, for converting analog input signals to parallel digital form, includes a multibit sigma-delta modulator (16; 216) including an input port (16i; 216i) to which the analog input signals are applied, and which produces an oversampled digital parallel data stream at its output port (16o; 216o). The performance of the sigma-delta modulator (16; 216) is subject to errors caused by both dynamic and static nonlinearity. A nonlinear filter corrector (250) is coupled to the output port (16o, 216o) of the sigma-delta modulator (16, 216), for receiving the parallel digital data stream. The nonlinear filter corrector (250), in response to the parallel digital data stream, generates at least one of a real and imaginary component (that is to say, the real component, the imaginary component, or both) of an estimate of the errors, and for subtracting the one (or both) of the real and imaginary components of the estimate of the errors from equivalent components of the parallel digital data stream. This subtraction produces at least a real component of the parallel digital data stream, corrected for the nonlinearity. A filter (270) with at least a low-pass characteristic is coupled to receive the one of the real and imaginary components of the parallel digital data stream, for removing out-of-band signal components therefrom. In one embodiment of the invention, the filter (270) with a low-pass characteristic is a decimation filter.

In an embodiment of the invention, the nonlinear filter corrector (250) further generates the other one of the real and imaginary components, and subtracts both the real and imaginary components of the estimate of the error from equivalent components of the parallel digital data stream, for thereby generating, in addition to the real component, an imaginary component of the parallel digital data stream.

In a preferred embodiment of the invention, the nonlinear filter corrector (250) comprises a tapped delay line (252) coupled to the parallel data stream (on signal path 219), for generating a delayed sample of the parallel data stream at at least one tap (254a). A lookup table (T1 of set 256) is coupled to the tap (254a), for producing real and imaginary components of the estimated error of the delayed sample. A summing arrangement (258, 260) is coupled to the parallel digital data stream and to the lookup table, for subtracting the real and imaginary components of the estimated error from corresponding components of the parallel digital data stream.

What is claimed is:

1. An analog-to-digital converter for converting analog input signals to parallel digital form, said analog-to-digital converter comprising:

a multibit sigma-delta modulator including an input port to which said analog input signals are applied, and which produces an oversampled digital parallel data stream at its output port, the performance of said multibit sigma-delta modulator being subject to errors caused by both dynamic and static nonlinearity;

nonlinear filter correction means coupled to said output port of said sigma-delta modulator for receiving said parallel digital data stream, for generating I and Q components of an estimate of said errors, and for subtracting said I and Q components of said estimate of said errors from equivalent components of said parallel digital data stream, for thereby producing I and Q components of said parallel digital data stream corrected for said nonlinearity; and a filter with at least a low-pass characteristic coupled to receive said I and Q components of said parallel digital data stream, for removing out-of-band signal components therefrom;

wherein said correction means comprises:

a tapped delay line coupled to said parallel digital data stream, for generating at one set of delayed samples of said parallel digital data stream at at least one tap:

a lookup table coupled to said tap, for producing said I and Q components of the estimated error of said parallel digital data stream; and summing means coupled to said parallel digital data stream and to said lookup table, for subtracting said I and Q components of said estimated error from corresponding components of said parallel digital data stream.

2. An analog-to-digital converter for converting analog input signals to parallel digital form, said analog-to-digital converter comprising:

a sigma-delta modulator including an input port to which said analog input signals are applied, and also including a forward signal path for resonating, sampling and quantizing a difference signal for producing a parallel digital data stream which represents the analog input signal, and also including a feedback signal path for generating an analog reconstruction of said digital parallel output, for aiding in generating said difference signals, said analog reconstruction being subject to nonlinearities which are equivalent to an error signal added to said analog reconstruction, said error signal being encoded with a delay by said sigma-delta modulator;

a summing circuit including a noninverting input port coupled to the output of said forward signal path, and also including an inverting input port, for subtracting an error signal from said parallel digital data stream; and nonlinear filter correction means coupled to said output port of said forward signal path, for receiving said parallel digital data stream and said encoded, delayed error signal, said filter correction means comprising (a) a tapped delay line, including at least one tap, coupled to said output of said forward signal path.

3. A corrected multibit analog-to-digital converter for converting analog input signals to parallel digital form, said compensated multibit analog-to-digital converter comprising:

a first summing node including first and second input ports, said analog input signals being applied to said first input port, for subtracting a feedback signal from said analog input signals, to thereby produce difference signals;

a resonator coupled to said first summing node for resonating said difference signals, for producing resonated difference signals;

a multibit analog-to-digital quantizer coupled to said resonator, for converting said resonated difference signals into a stream of parallel digital samples, said analog-to-digital quantizer introducing adc noise and distortion signals into said parallel digital samples;

a feedback path coupled to said analog-to-digital quantizer and to said second port of said first summing node, said feedback path including a digital-to-analog converter, for reconstructing analog feedback signals from said parallel digital samples, said digital-to-analog converter introducing dac noise and distortion signals into said analog feedback signals, and for applying said analog feedback signals and their associated noise and distortion to said second port of said first summing node, thereby closing a feedback loop, whereby said resonator is a resonator loop filter, said difference signals are the difference between said analog input signals and said analog feedback signals with their associated noise and distortion, said resonated difference signals include, within a given passband, adc noise and distortion equivalent signals of a phase which tend to cancel said adc noise and distortion signals produced by said analog-to-digital quantizer, and said stream of multibit digital samples produced by said multibit analog-to-digital converter include components of said dac noise and distortion signals;

a second summing node including a first port coupled to receive said stream of multibit digital samples and also including a second port, for taking the difference between correction signals applied to said second port and said multibit digital samples, for thereby generating corrected multibit digital signals;

a tapped delay line coupled to receive said stream of multibit digital samples, for generating delayed samples of said multibit digital samples;

a plurality of look-up tables, at least one of said look-up tables being coupled to a tap of said tapped delay line for receiving said delayed samples of said multibit digital samples, and for generating, at least within said given passband in response to said delayed samples of said multibit digital samples, at least one of the real and imaginary components of said dac noise and distortion;

a third summing node coupled to said plurality of look-up tables and to said second port of said second summing node, for summing together those of said real and imaginary components of said dac noise and distortion produced by said look-up tables, for thereby generating said correction signals for said second port of said second summing node.

4. A method for operating an analog-to-digital converter including (a) a multibit sigma-delta modulator including an input port to which said analog input signals are applied, and which produces an oversampled digital parallel data stream within a given bandpass at its output port, the performance of said modulator being subject to errors caused by both dynamic and static nonlinearity, said multibit sigma-delta modulator tending to reducing the noise of said adc quantizer within said bandpass, but not significantly reduce the noise of said dac within said bandpass, and (b) nonlinear filter correction means coupled to said output port for receiving said parallel digital data stream, for estimating said error, and for subtracting said estimated error from said parallel digital data stream, for thereby improving the dynamic range of said sigma-delta modulator, said method comprising the steps of:

applying to said analog input port a sinusoidal analog training signal, and which is of an amplitude selected to exercise the full dynamic range of said sigma-delta modulator;

storing in memory a set of sequential samples of said digital signal resulting from said step of applying;

using a model of the errors in said sigma-delta modulator, performing mathematical operations, on data stored in memory as a result of said step of storing, which define the delays and amplitude transfer functions of said nonlinear filter correction means, for tending to reduce said error.

5. A method according to claim 4, wherein said step of using a model of the errors comprises the steps of:

attenuating all components of said sequential samples of said data stored in memory which lie outside said given bandpass to generate filtered sequential samples;

converting the values of said stored sequential samples into parallel digital dac code signals having values of zero and one;

generating a matrix of time-sequential column vectors composed of said parallel digital dac code signals;

generating a sequence of time-sequential code samples from said matrix of time-sequential column vectors, to thereby produce a sequence of time-sequential code samples;

filtering each sequence of time-sequential code samples to tend to eliminate noise and distortion components lying outside said given bandpass and to also tend to eliminate said sinusoidal analog training signal, to thereby produce filtered time-sequential code samples;

constructing an observation matrix by selecting the number of stages to be used in a delay line of said nonlinear filter, and the delay value of each stage of said delay line, and arranging the filtered time-sequential code samples as column vectors in said observation matrix, so that for each time-sequential code sample, columns sequentially represent the cumulative delay of said delay line, with the result that each code is represented by a submatrix;

conditioning said observation matrix by adding noise by multiplying said observation matrix by an equal-size matrix containing unitary values summed with noise values, which noise value is scaled to be less than unity, to produce a conditioned observation matrix;

calculate a covariance matrix from said conditioned observation matrix;

computing the cross-correlation vector between said sequential bandlimited signals and the complex conjugate of said observation matrix;

computing the error filter weights as the product of the inverse of said covariance matrix multiplied by said cross-correlation vector for producing the error filter weights as a filter weight vector; and decoding said filter weight vector to produce said error filter weights for said table.

* * * * *